United States Patent
Roemersperger et al.

(10) Patent No.: US 12,055,593 B2
(45) Date of Patent: Aug. 6, 2024

(54) METHOD FOR PARAMETER ESTIMATION IN AN IMPEDANCE MODEL OF A LITHIUM ION CELL

(71) Applicant: Bayerische Motoren Werke Aktiengesellschaft, Munich (DE)

(72) Inventors: Stefan Roemersperger, Munich (DE); Jan Philipp Schmidt, Holzmaden (DE); Tobias Thiem, Munich (DE); Christopher Wagner, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 17/767,569

(22) PCT Filed: Sep. 24, 2020

(86) PCT No.: PCT/EP2020/076766
§ 371 (c)(1),
(2) Date: Apr. 8, 2022

(87) PCT Pub. No.: WO2021/069232
PCT Pub. Date: Apr. 15, 2021

(65) Prior Publication Data
US 2024/0085485 A1    Mar. 14, 2024

(30) Foreign Application Priority Data
Oct. 10, 2019    (DE) .................. 10 2019 127 384.6

(51) Int. Cl.
*G01R 31/389*    (2019.01)
*G01R 31/367*    (2019.01)
(Continued)

(52) U.S. Cl.
CPC ......... *G01R 31/389* (2019.01); *G01R 31/367* (2019.01); *G01R 31/3842* (2019.01); *G01R 31/392* (2019.01); *G01R 31/396* (2019.01)

(58) Field of Classification Search
None
See application file for complete search history.

(56) References Cited

U.S. PATENT DOCUMENTS

2008/0048662 A1*   2/2008   Hirsch ................ G01R 31/389
                                                         324/430
2009/0096459 A1    4/2009   Yoneda et al.
(Continued)

FOREIGN PATENT DOCUMENTS

| DE | 10 2017 218 715 A1 | 4/2019 |
|---|---|---|
| EP | 1 129 343 B1 | 6/2008 |
| GB | 2532726 A | 6/2016 |

OTHER PUBLICATIONS

International Search Report (PCT/ISA/210) issued in PCT Application No. PCT/EP2020/076766 dated Dec. 22, 2020 with English translation (four (4) pages).
(Continued)

*Primary Examiner* — Jas A Sanghera
(74) *Attorney, Agent, or Firm* — Crowell & Moring LLP

(57) ABSTRACT

A method for determining the parameters of an equivalent circuit for representation of the impedance of a lithium ion cell is provided. The equivalent circuit includes at least one RC element having an ohmic resistor R1, a capacitor C1, and a series resistor Rs. The series resistor Rs is determined by an impedance measurement.

9 Claims, 5 Drawing Sheets

(51) Int. Cl.
    *G01R 31/3842*     (2019.01)
    *G01R 31/392*     (2019.01)
    *G01R 31/396*     (2019.01)

(56) References Cited

U.S. PATENT DOCUMENTS

2014/0287287 A1*    9/2014    Osaka ................ H01M 10/613
                                                                                                                            324/430
2019/0146038 A1      5/2019    Matsumoto et al.

OTHER PUBLICATIONS

German-language Written Opinion (PCT/ISA/237) issued in PCT Application No. PCT/EP2020/076766 dated Dec. 22, 2020 (seven (7) pages).
German-language Search Report issued in German Application No. 10 2019 127 384.6 dated Sep. 8, 2020 with partial English translation (19 pages).

* cited by examiner

METHOD FOR PARAMETER ESTIMATION IN AN IMPEDANCE MODEL OF A LITHIUM ION CELL

BACKGROUND AND SUMMARY OF THE INVENTION

The invention relates to a method for ascertaining the parameters of an equivalent circuit diagram for representing the impedance of a lithium ion cell, and to a battery monitoring method and to a battery system that use the method.

Electrochemical impedance spectroscopy (EIS) is an established method that may be used, inter alia, to characterize lithium ion cells.

It involves applying an excitation signal to the cell, which may be an AC current signal (I(t), galvanostatic) or an AC voltage signal (U(t), potentiostatic), measuring the corresponding response signal (U(t) or I(t), respectively), and calculating the generally complex impedance Z from the excitation signal and the response signal as U(t)/I(t). In order to record a spectrum, the frequency of the excitation signal may be varied, or multiple frequencies may be overlaid. As an alternative, it is also possible to use a pulse, which represents the overlaying of a number of frequencies, and the spectrum is obtained through Fourier transformation.

The measured impedance or the impedance spectrum may be analyzed in a model-based manner using equivalent circuit diagrams that consist of components having a defined impedance, in particular ohmic resistors R, capacitive elements C ("capacitor") and inductive elements L ("coil"). In the case of electrochemical systems, in which the diffusion rate of the charge carriers in the electrical line plays a role, it is also possible to add what are known as Warburg elements W.

The electrode of an electrochemical cell is typically modeled at least as an RC element, in which C is supposed to reflect the capacitance of the electrochemical dual layer at the electrode interface and R is supposed to reflect the charge transfer resistance. The electrical resistance of the electrolyte is represented as a series resistance $R_S$. A lithium ion cell has two electrodes, and the equivalent circuit diagram may therefore comprise for example at least two RC elements and a series resistance. Simplified models having a single RC element and a series resistance are however also possible. The models may furthermore contain a series inductance L in order to take account of the inductance of the supply lines and the geometric structure, which are likewise incorporated into the measurement result from evaluation electronics. Although the physical relevance of L in terms of the processes in the cell is low, the overlaying in the frequency range with components of further RC elements would give rise to an error if this inductance were to be ignored.

Fitting the model parameters (that is to say of $R_S$, the various R and C of the RC elements, etc.) to the measured impedance spectrum makes it possible to draw conclusions as to the internal processes in the cell, for example as to the electrolyte conductivity and the kinetics of the electric processes, which ultimately makes it possible to diagnose the cell state.

Such a technique may be used when manufacturing and inspecting the quality of lithium ion cells. Reference is made here for example to US 2009/0096459, which describes a method for measuring the frequency dependence of the impedance in order to determine the mobility of the charges on the surface of the negative and the positive electrode of a lithium ion cell. In this case, special methods for creating equivalent circuit diagrams and determining the parameters for modeling the cell behavior are used.

A further field of application, in addition to quality inspection in manufacture, is that of diagnosing the cell state of cells in use, for instance in order to establish their state of health and to ascertain whether the cell needs to be replaced. For this purpose, the cell may for example be disconnected from the grid at predefined maintenance intervals in the laboratory or in a workshop, brought to a defined state of charge (SOC) and a defined temperature (T) and then investigated by way of EIS.

In particular when the cell is exposed to heavy and fluctuating loads, as occurs for instance in the case of use in electrically operated vehicles, it is desirable for the diagnosis by way of EIS also to be able to be performed online during ongoing operation. The battery management system (BMS) should preferably be capable, at all times, of outputting a forecast about the state of health of the cell in a model-based manner using the current and voltage data. To this end, it is necessary to be able to determine the model parameters during ongoing operation.

Unlike the stationary test in the laboratory or in a workshop as outlined above, the difficulty however arises here that the cell is not readily able to be brought to a defined state with regard to SOC and T.

Instead, either the in each case prevailing SOC or T values have to be measured independently and are incorporated into the forecast together with the impedance parameters, or they likewise have to be predicted from the impedance model. In the first case, the reliability of the forecast is limited by the limited measurement accuracy for SOC and T, and in the second case it is limited by the additional degrees of freedom of the system with regard to SOC and T, which reduce the quality of the fit or of the numerical parameter determination.

In addition to these main difficulties of increased complexity accompanied by reduced accuracy of the boundary conditions with regard to T and SOC, practical aspects are also relevant, for instance in relation to the high requirement in terms of signal quality and synchronicity of current and voltage signal, the required data rates in terms of signal recording or the required computing power for optimizing the parameters. In the case of diagnosis during ongoing operation, these factors have to be provided by the on-board electronics, for instance by the battery management system (BMS). It is not possible to use a dedicated laboratory EIS device that is in principle able to deliver an arbitrarily high signal quality, synchronicity and computing power.

On the whole, in the case of online parameter determination during ongoing operation, there is thus the difficulty that, on the one hand, complexity increases due to the additional free parameters or parameters to be measured SOC and T, and, on the other hand, the performance of the measuring and evaluation apparatuses available is limited in terms of signal quality, synchronicity and computing power.

In light of this problem, there is a need for a method for ascertaining the model parameters of the equivalent circuit diagram with reduced complexity, which method allows improved reliability of the online diagnosis of a lithium ion cell during ongoing operation.

In order to solve the above problem, what is provided, according to embodiments of the invention, is a method for ascertaining the parameters of an equivalent circuit diagram for representing the impedance of a lithium ion cell, in which the equivalent circuit diagram comprises at least one RC element having an ohmic resistance $R_1$ and a capacitance $C_1$ and a series resistance $R_S$, and the parameters comprise at least $R_S$, $R_1$ and $C_1$, in which the method contains the following steps:

performing a first measurement in order to determine at least the real part and optionally also the imaginary part of the impedance of the cell at a first frequency above 300 Hz;

ascertaining the series resistance $R_S$ from the measured real part of the impedance;

performing at least one further measurement in order to determine the real part and imaginary part and/or absolute value and phase of the impedance of the cell at at least one further frequency that is lower than the first frequency;

subtracting at least the series resistance $R_S$ from the result of the one or more further measurements;

ascertaining the other model parameters, including $R_1$ and $C_1$, from the result.

The equivalent circuit diagram (impedance model) preferably also has a series inductance L that takes into account the possible influence of the inductance of the electrical structure. It may be incorporated into the model as a predetermined fixed parameter or be determined through measurement in the same way as the series resistance $R_S$.

Further aspects of the invention concern a battery monitoring method that makes use of an impedance model whose parameters are ascertained by the method according to an embodiment of the invention, a battery management system in which the battery monitoring method is implemented, and a battery system that comprises the battery management system.

DETAILED DESCRIPTION OF THE DRAWINGS

General Points

As explained above in the section regarding the technical background, lithium ion cells may be modeled by an equivalent circuit diagram that comprises at least one RC element and a series resistance $R_S$. The series resistance $R_S$ essentially reflects the electrolyte conductivity, which for its part depends primarily on the temperature and on the state of health (SOH). The RC element is used to model the electrode processes, wherein C indicates the dual layer capacitance and R indicates the charge transfer resistance. R and C may depend on the temperature, the state of health and also the state of charge (SOC), which influences the electrochemical potential of the electrode.

The present invention relates to a method for ascertaining the model parameters of such an impedance model. Model parameters are understood here to mean in particular the resistance values, capacitances, inductances and possibly also Warburg elements of the circuit elements present in the equivalent circuit diagram. The model parameters thus comprise the resistance value of the series resistance $R_S$ (which is ascertained through measurement according to an embodiment of the invention) and the capacitance $C_1$ and the resistance $R_1$ of the at least one RC element.

Furthermore, at higher frequencies (more than 100 Hz), influences of the inductance may already be foreseen. The inductance is defined by the spatial arrangement of the metal conductors involved (conductor foils, wires, etc.) and is essentially independent of temperature and SOC. However, it may slightly overlap with the frequency range of the other effects depending on the temperature range (or the values for $R_S$, R and C, which are in turn temperature-dependent). The equivalent circuit diagram in the method according to an embodiment of the invention therefore preferably has a series inductance L, which is able for example to be incorporated into the model as a previously determined fixed value (apparatus constant), or else may likewise, like the series resistance $R_S$, be determined through impedance measurement.

In more complex models, $C_2$ and $R_2$ may also be added as further parameters for a second RC element, for example, possibly along with further RC elements or even Warburg elements Aw.

The present invention is based on the observation that, at high frequencies, the contributions of the RC elements (including possibly Warburg elements that they contain) become negligible. The impedance is then defined essentially by the electrolyte resistance and by the electrical resistance and the inductance of the metal conductors involved (conductor foils, wires, etc.).

Figure 1:
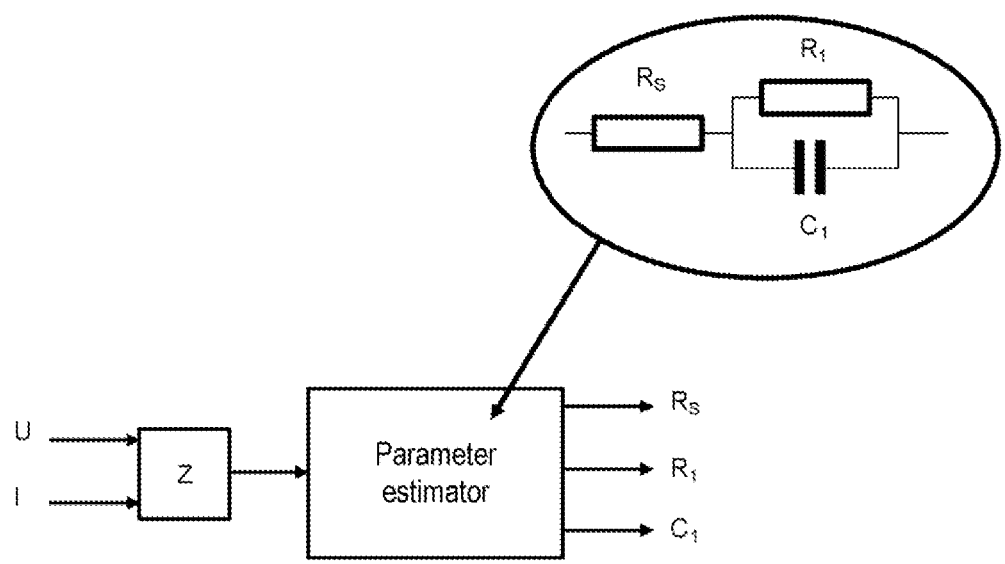
FIG. 1 schematically shows a method from the prior art for ascertaining the parameters $R_S$, $R_1$ and $C_1$ of an impedance model that comprises a series resistance and an RC element. The impedance is calculated based on the voltage and current signal, and all three parameters are ascertained numerically from the obtained impedance data.
Figure 2:
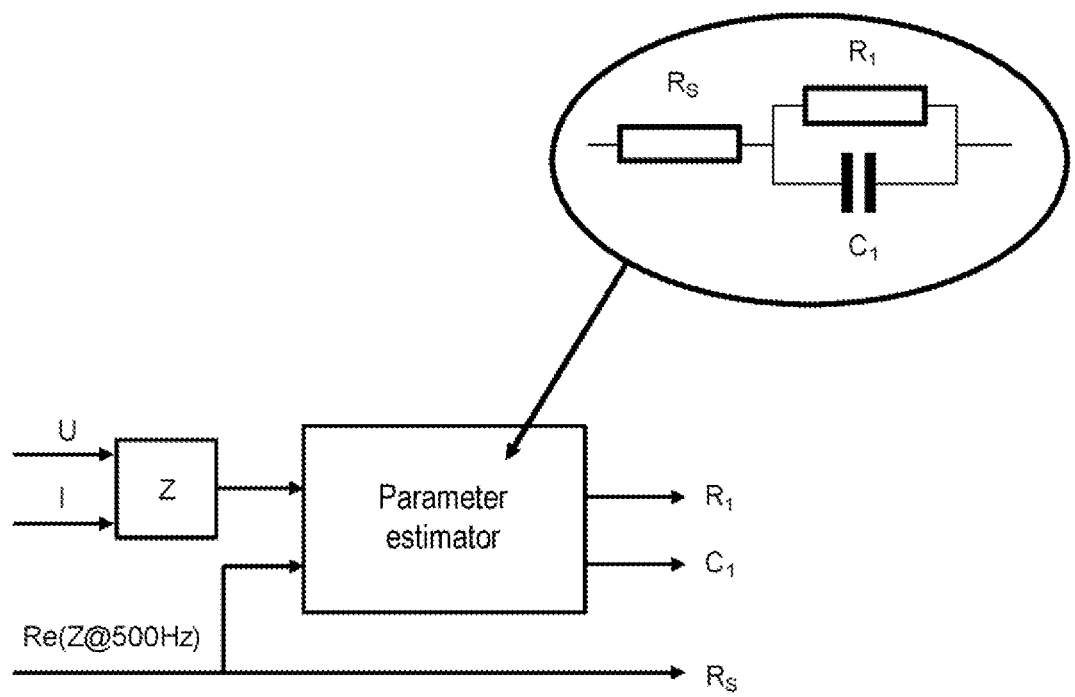
FIG. 2 schematically shows the method according to an embodiment of the invention. The impedance of the RC element disappears at a high frequency (for example 500 Hz), meaning that the series resistance is able to be ascertained directly in a separate measurement. $R_S$ no longer has to be determined by the estimation algorithm, but rather is incorporated as an additional input signal in addition to the current and voltage signal, and thus improves the estimate of $R_1$ and $C_1$.

In the method according to an embodiment of the invention, the series resistance therefore does not have to be estimated as a further parameter by fitting to the current and voltage data, as illustrated in FIG. 1, this constituting an additional degree of freedom and reducing the accuracy of the estimate. Instead, $R_S$ is measured explicitly and is incorporated into the model as a fixed parameter (see FIG. 2). The number of degrees of freedom (that is to say of the parameters to be determined by the fit) is thus reduced, and the accuracy of the estimate is able to be improved.

Operating Principle

The operating principle outlined above is intended to be illustrated below for the simplest case of a simple RC element ($C_1$ and $R_1$) having a series resistance $R_S$ ($R_S$-RC model). In the following discussion, for the sake of simplifying the notations, both frequencies f (Hz) and angular frequencies ω (=2πf) are used next to one another and referred to collectively as "frequency". It is obvious from the symbol (o or f) which frequency is meant.

Figure 3:
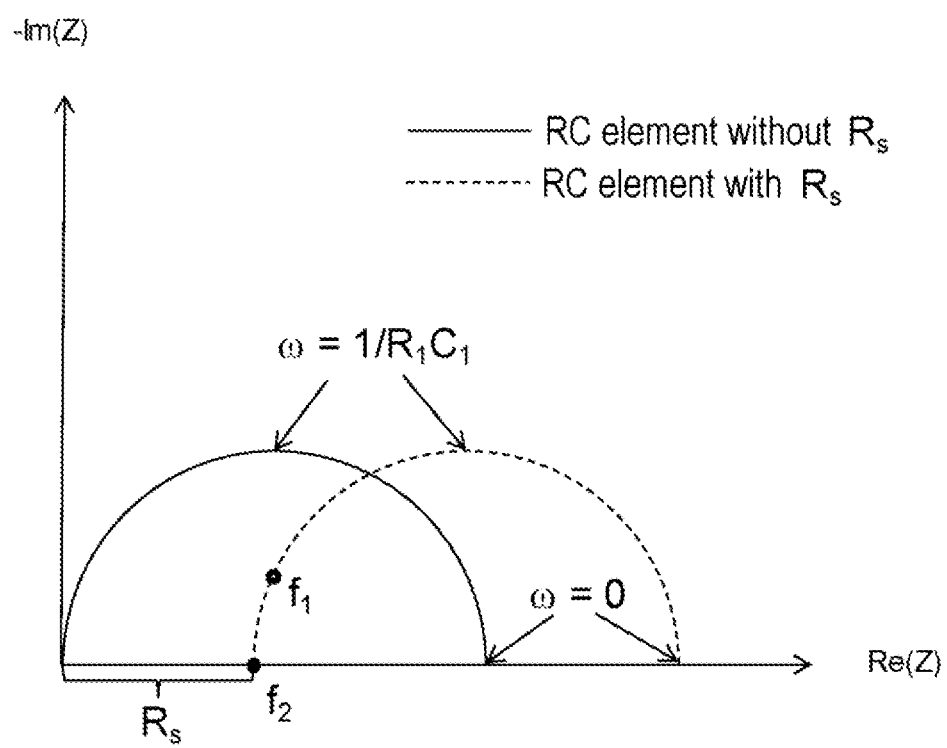
FIG. 3 schematically shows the plot of real and imaginary part of the impedance (Nyquist plot) of an RC element with and without a series resistance ($R_S$-RC model and RC model) for different frequencies. The plot ideally has the shape of a circular arc whose summit is at $\omega=1/R_1C_1=1/\tau$, in which $\tau$ represents the time constant of the RC element; the left-hand side of the circular arc shows the impedance at higher frequencies and the right-hand side shows it at lower frequencies. The series resistance RS causes a shift along the Re(Z) axis.

$R_S$ is purely real, and for the RC element formed from $C_1$ and $R_1$, real and imaginary part of the impedance Z are frequency-dependent, where:

$$Z_{RC}(R_1C_1, \omega) = R_1/(1 + i\omega * R_1C_1)$$
$$= R_1/(1 + (\omega R_1C_1)^2) - i\omega R_1^2 C_1/(1 + (\omega R_1 C_1)^2)$$

wherein ω is the angular frequency of the excitation signal. At ω=0, the imaginary part disappears and the denominator of the real part approaches 1, that is to say the impedance corresponds to the resistance $R_1$. When ω approaches infinity, both the real part and the imaginary part approach zero. At ω=1/$R_1C_1$ (=1/τ; τ: time constant of the RC element), real part and imaginary part are each $R_1/2$ and $-iR_1/2$, respectively, that is to say the phase angle of the impedance is 45°. If real and imaginary part of the impedance are thus plotted for frequencies from zero to infinity, then this gives rise to a semicircle of radius $R_1/2$. Without a series resistance, this would run on the real axis from 0 to R. The series resistance is an additive constant and causes a shift by $R_S$ along the real axis, as shown in FIG. 3.

It is thus possible to directly measure $R_S$ at very high excitation frequencies, at which the impedance of the RC element approaches zero, and $R_S$ then corresponds to the intersection of the plot with the real axis. This corresponds to the point $f_2$ in FIG. 3. In a pure model of series resistance and RC element ($R_S$-RC model), it would already be sufficient for the real part of the impedance of the RC element to approach zero, this already being the case at lower frequencies and corresponding to the point $f_1$ in FIG. 3. Even if the imaginary part still has a significant value, the real part at the point $f_1$ already corresponds to the value at the intersection to a good approximation.

Figure 4:
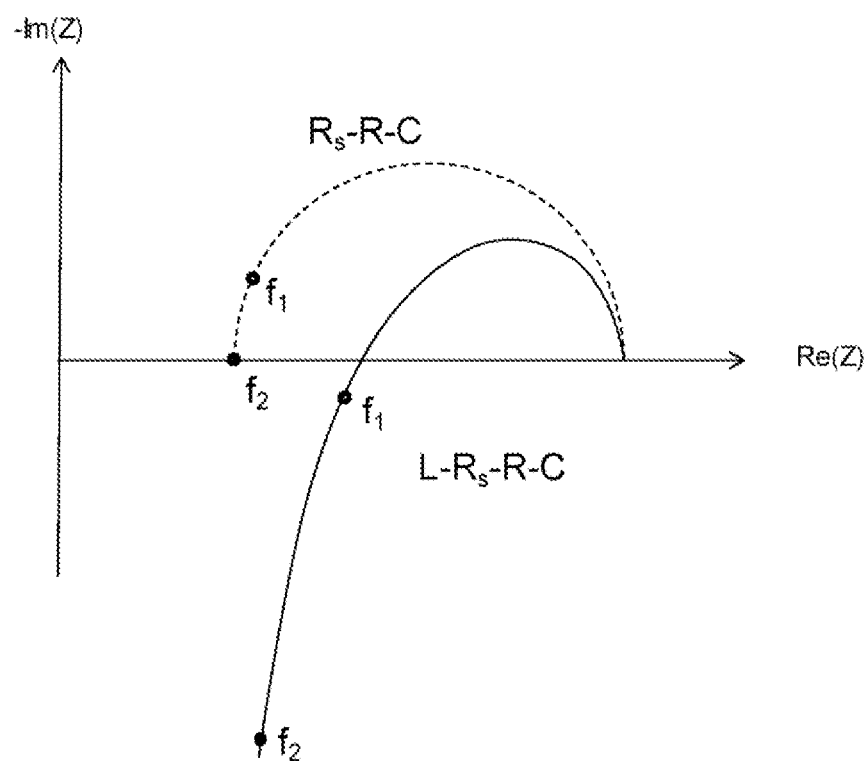
FIG. 4 schematically shows the plot of real and imaginary part of the impedance of an RC element with a series resistance and series inductance (L-$R_S$-RC model) for different frequencies. The series inductance causes a shift of Im(Z) by $i\omega L$ (that is to say "downward" on the Im(Z) axis), such that increasing deviations from the $R_S$-RC model occur at high frequencies.

However, due to the inductance, there may be considerable deviations from this behavior, wherein the extent of the deviation depends on the absolute value of L, on the one hand, and on the values of $R_S$, $R_1$ and $C_1$ and thus on the temperature, on the other hand. At high temperatures (for example above 25° C.), the impedance $Z_{RC}(R_1C_1, \omega)$ of the RC element is low and the characteristic time constant (that is to say the "summit" of the circular arc in FIG. 3) is shifted greatly toward higher frequencies. On the other hand, the contribution of the inductance L is proportional to the frequency and has the value iωL, that is to say L causes an increasing shift in the imaginary direction as the frequency increases. These effects may thus be overlaid, as shown in FIG. 4. Since the plot is made on the imaginary axis $-\text{Im}(Z)$, there is a "downward" shift in the plot.

Due to this overlay, the real part may differ significantly from the value for the $R_S$-RC model at the point $f_1$, and no longer necessarily constitutes a good approximation for $R_S$. In the method according to an embodiment of the invention, a model with an additional series inductance L (L-$R_S$-RC model) is therefore preferably used. The overall impedance is thus:

$$Z_{Ges} = R_S + i\omega L + Z_{RC}(R_1C_1, \omega)$$

In one embodiment, the inductance L may be assimilated to a previously known constant, which was determined for example through a separate measurement and is incorporated into the model as a fixed parameter. In this case, the impedance of the inductance (iωL) may be calculated easily and subtracted from the measured value, and the method is then continued in the same way as in the $R_S$-RC model.

As an alternative, the inductance L may also be determined through impedance measurement. For this purpose, for example, the first measurement may additionally acquire the imaginary part and be performed at a high frequency of for example 1 kHz or more, preferably 5 kHz or more. When the frequency is high enough, the RC element is in turn largely decoupled, meaning that the real part of the impedance corresponds roughly to $R_S$ and the imaginary part corresponds roughly to −iωL (see point $f_2$ in FIG. 4). $R_S$ and L may thus be ascertained from the real and imaginary part of the impedance. The value of L obtained as a result may then be used to calculate the impedance contribution of the inductance in the further measurements at lower frequencies, which is in turn subtracted in order to continue the method in the same way as in the $R_S$-RC model.

As a further alternative, in particular when sufficiently high frequencies at which the impedance of the RC element becomes negligible are not available, a measurement of real part and imaginary part may also be performed at two or more frequencies (for example $f_1$ and $f_2$ in FIG. 4), and L is determined from the measured impedance values by fitting, wherein for example initially current estimated values for $R_1$ and $C_1$ may be taken as a basis, these then being able to be iteratively fine-tuned.

In one preferred embodiment, at least four different frequencies $f_1$, $f_2$, $f_3$ and $f_4$ are used, as shown in FIG. 4.

$f_1$ is preferably close to the zero crossing (Im(Z)=0) in the Nyquist plot, that is to say, in the L-$R_S$-RC model, the contribution of L and the imaginary part of the contribution of the RC element precisely cancel one another out, that is to say it holds true that $i\omega L = i\omega R^2 C/(1+(\omega RC)^2)$, and thus $\omega = (1/LC - 1/R^2C^2)^{1/2}$. Since R and C are temperature-dependent, the zero crossing frequency may vary therewith, this being for example between 300 Hz and 1 kHz.

$f_2$ is preferably at least 5 times $f_1$, in particular at least 10 times, or may for example also correspond to the highest frequency that is able to be measured by the measuring arrangement that is used, and is for example more than 1 kHz, preferably at least 5 kHz.

$f_3$ is lower than $f_1$ and is preferably on the apex of the curve, that is to say at dIm(Z)/dω=0.

$f_4$ is the lowest frequency and is preferably in the range of 0.1$f_3$, for example between 10 and 50 Hz.

The values for $f_1$, $f_2$, $f_3$ and $f_4$ may be ascertained from the starting or current estimated values of the parameters of the L-$R_S$-RC model, taking into consideration SOC and temperature. The initially selected frequencies may then be retained with regard to simplifying the measurement, or they may be continually adapted to the parameters estimated in the method according to an embodiment of the invention or the changes of SOC and temperature. It is also possible for example to retain the boundary values $f_2$ and $f_4$ and only to adapt $f_1$ and $f_3$ to the amended estimated values.

The same also applies to equivalent circuit diagrams with multiple RC elements. In this case, each RC element, when the impedance is plotted for different frequencies, delivers a circle having a different time constant T and thus a different position in the plot according to FIG. 3. What is crucial however is that the above formula applies to each RC element and, when the frequency is high enough, both the real and the imaginary part disappear, that is to say $Z_{RC}(R_1C_1, \omega)$ becomes zero, meaning that only the real contribution of $R_S$ and the imaginary contribution of L remain as impedance Z. Thus, when the excitation frequency is high enough, the series resistance may be determined directly from the real part of the impedance.

A new measurement of the impedance $Z_{Ges}$ may then subsequently be performed at a lower frequency $\omega$. The previously measured value $R_S$ and the contribution of the inductance are subtracted from $Z_{Ges}$ in order to obtain the impedance of the RC element, $Z_{RC}(R_1C_1, \omega)$. If both real and imaginary part of the impedance have been measured, $R_1$ and $C_1$ are able to be calculated directly from the above equations. As an alternative, for example, only the real part or only the absolute value at a first frequency $\omega_1$ and additionally the real part or the absolute value at a second frequency $\omega_2$ may be measured; in any case, this gives a system of two equations and two unknowns, from which $R_1$ and $C_1$ are then able to be calculated.

The same accordingly applies to the case of multiple RC elements, wherein multiple measurements may then possibly need to be performed in order to obtain all parameters. Since each RC element contains two further parameters ($R_2$, $C_2$, etc.), two measured values per RC element would be required in theory, for example real part and imaginary part of the impedance at a further frequency $f_5$, which is preferably in the range of the time constant of the RC element (summit of the associated circular arc in the Nyquist plot with dIm/df=0). In the same way as the above explanations regarding $f_1$-$f_4$, $f_5$ may be ascertained for example from the currently estimated parameter set of the model, and may possibly be adapted to the amended estimated values.

In any case, the contribution of $R_S$ and possibly of L is subtracted from the measured impedance values, and the rest of the model parameters are calculated from the result. If an analytical solution is unfeasible, for instance because the associated system of equations is overdetermined or underdetermined, the parameters may also be ascertained numerically through conventional fitting methods (for example least-squares fitting).

Impedance Measurement

Generally speaking, the impedance may be measured by applying an oscillating current signal (I(t), galvanostatic) or voltage signal (U(t), potentiostatic) to the cell as excitation signal and measuring the corresponding response signal U(t) or I(t), respectively. The impedance may then be calculated as U(t)/I(t) and is generally complex. Since, in conventional battery systems, voltage monitoring apparatuses are typically provided on each cell in any case, it is preferable according to an embodiment of the invention to use a current signal as excitation signal and to measure the voltage as response signal.

The excitation signal may comprise a single frequency or a superposition of multiple frequencies, and said signal may be applied to the cell continuously or in a pulsed manner. The frequencies are not especially restricted and may for example be in the range from 10 Hz to 10 kHz.

The series resistance $R_S$ and possibly the inductance L are measured at a frequency of 300 Hz or more, preferably 500 Hz to 5 kHz. For such frequencies, $\omega$ is considerably above the reciprocal time constants of the RC elements involved, meaning that $R_S$ may be inferred from the real part of the impedance and L may be calculated from the imaginary part.

In order to determine the parameters $R_1$ and $C_1$ and the parameters of any other circuit elements, one or more impedance measurements are also performed at correspondingly lower frequencies, such that $\omega$ is preferably in the range of the reciprocal time constants of the circuit elements involved. By way of example, one or more measurements may be performed at frequencies in the range of 10 to 200 Hz, preferably 20 to 100 Hz. As explained above, the frequencies may either be predetermined, for example on the basis of the time constants calculated from the initial model parameters, or they may be adapted continuously to the parameters estimated by the method according to an embodiment of the invention. Real and imaginary part and absolute value and phase of the impedance are determined in each measurement.

Battery System

The method according to an embodiment of the invention is typically part of a battery monitoring method for predicting the state of health and forecasting the future power characteristics of lithium ion cells that is implemented in the management system of a battery system (BMS). The present invention thus also relates to a model-based battery monitoring method that is characterized in that the model parameters are ascertained using the method according to an embodiment of the invention, and to a battery system that is configured so as to perform the method.

A battery system for an electrically operated or hybrid-electrically operated vehicle may in particular be involved here. Such a battery system comprises a plurality of lithium ion cells that are controlled by a battery management system (BMS).

The cells are typically connected in series and/or in parallel in groups to form battery packs and each connected to a cell monitoring unit that at least monitors the cell voltage and also controls charge balancing. In this case, each individual cell may be provided with a cell monitoring unit, or a plurality of cells may be connected to a cell monitoring unit. Said cell monitoring unit may have a plurality of input channels for voltage measurement in order to be able to simultaneously monitor the cells connected thereto, or the monitoring may be performed using a multiplexing method. All of the cells and cell monitoring units are in turn monitored by a battery management unit (BCU, battery control unit).

The excitation signal for the impedance measurement is preferably injected in the form of an AC current signal, this being able to be performed per cell, for example via the balancing current, or globally from the outside. According to an embodiment of the invention, a first excitation signal having a frequency above 300 Hz may be provided in order to measure $R_S$ and at least one further excitation signal having a frequency of 10 to 200 Hz may be provided, or, as an alternative, the required frequencies may also be overlaid in an individual excitation signal.

The response signal is a voltage signal that has the same frequency as the excitation signal, but may possibly be phase-shifted. Detection may be performed for example by the already present voltage measurement function of the cell monitoring unit.

If the voltage is digitally recorded with a high enough sampling rate and resolution, the response signal may be ascertained from the high-frequency component of the sampling data acquired in the voltage measurement. The sampling rate should in this case, according to the sampling theorem, be at least twice the highest excitation frequency, preferably at least four times. Sampling rates of 1-20 kHz are typically sufficient for the method according to an embodiment of the invention. Otherwise, the high-frequency component may for example be coupled out by a high-pass filter, and recording is performed using a separate device or a separate measurement input having a suitably high sampling rate and resolution. The impedance values required according to an embodiment of the invention are ascertained from the excitation signal and the response signal.

The battery management system is configured such that it is able to make a model-based prediction of the state of health and forecast of the future power characteristics of the individual cells, for which purpose the model parameters that are estimated by the method according to an embodiment of the invention have to be known.

$R_S$ is defined primarily by the electrolyte resistance, which is dependent firstly on temperature and secondly on state of health. The temperature may be measured by sensors or ascertained from the impedance on the basis of known methods, such that the temperature influence is able to be eliminated and the state of health of the electrolyte is able to be determined.

Further influencing factors for $R_S$ are the contact resistances at the electrodes, which arise for example due to delamination, cover layer formation or swelling. These effects may in turn be separated from the electrolyte conductivity due to the different temperature behavior.

The RC element on the other hand models the electrochemical processes on the electrode surface. In this case, R represents the charge transfer resistance, which is influenced for example by cover layer formation or phase conversion in the material and particle cracking and delamination, but on the other hand also by the temperature and the chemical potential of the active material and thus the state of charge (SOC). C stands for the dual layer capacitance and is for example likewise influenced by particle cracking and the accompanying enlarging of the surface. By knowing and eliminating the influence of T and SOC, R and C thus allow a diagnosis of the state of health of the electrode.

On the whole, the model parameters thus allow, taking into consideration temperature and SOC, a detailed conclusion about the state of health of the cell. Delamination of the electrodes thus leads for example to an increase in $R_S$ and R to roughly the same extent, while the degradation of the electrolyte essentially increases just $R_S$. Thus, by knowing the individual parameters, it is possible to make a founded statement about the state of health of the cell, and the estimate about the remaining value and the remaining service life of the cell is thus able to be improved. This makes it possible for example to adapt the operating limits of the cell in order to stay safe and to minimize further aging.

Figure 5:
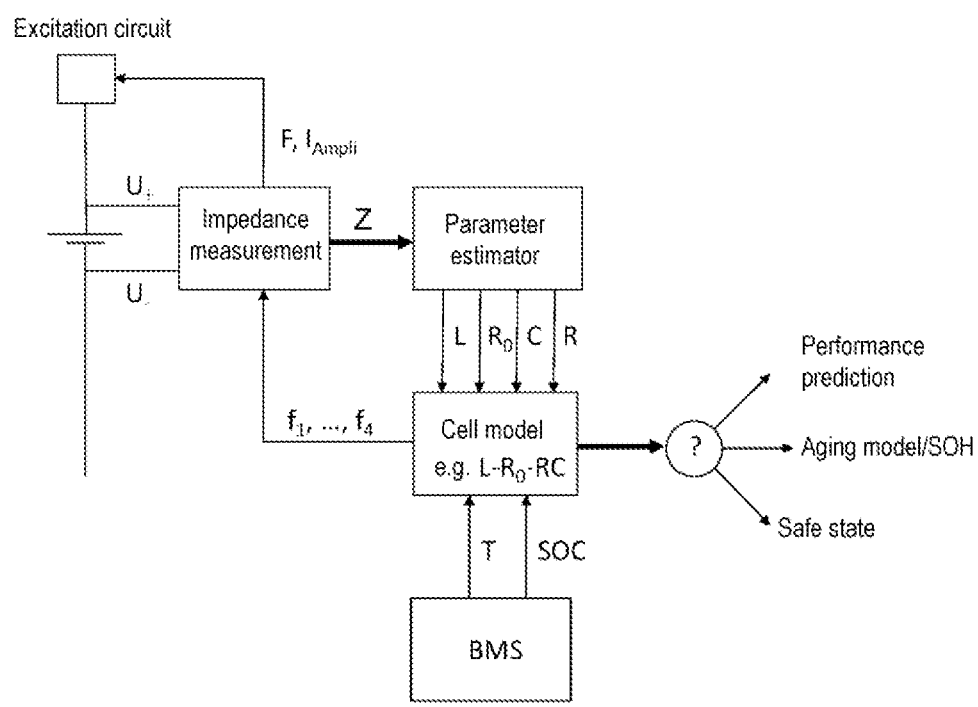
FIG. 5 schematically shows the method according to an embodiment of the invention for an L-$R_S$-RC model.

FIG. 5 schematically illustrates the structure of a battery system in which the method according to an embodiment of the invention is implemented. The functional blocks that are shown comprise the impedance measurement and the parameter estimator for each cell and the cell model by way of which the state of health is able to be ascertained or predicted from the parameters and from the temperature and SOC data, for example. The functions may in this case be implemented in the same controller or in different controllers. By way of example, impedance measurement and parameter estimation may be performed by the cell monitoring units, while the model-based forecast of SOH and further service life is performed in the BCU.

The invention claimed is:

1. A method for ascertaining parameters of an equivalent circuit diagram for representing an impedance of a lithium ion cell, wherein the equivalent circuit diagram comprises at least one RC element having an ohmic resistance $R_1$, a capacitance $C_1$, and a series resistance Rs, and the parameters comprise the ohmic resistance $R_1$, the capacitance $C_1$, and the series resistance Rs, the method comprising the steps of:
   (a) performing a first measurement in order to determine at least a real part of the impedance of the cell at a first frequency above 300 Hz;
   (b) ascertaining the series resistance Rs from the measured real part of the impedance;
   (c) performing at least one further measurement in order to determine the real part and an imaginary part, and/or an absolute value and a phase of the impedance of the cell at at least one further frequency that is lower than the first frequency;
   (d) subtracting at least the series resistance Rs from a result of the at least one further measurement; and
   (e) ascertaining the ohmic resistance $R_1$ and the capacitance $C_1$ from the result.

2. The method according to claim 1, wherein the first measurement is also performed to determine the imaginary part of the impedance of the cell at the first frequency.

3. The method according to claim 1, wherein the equivalent circuit diagram further comprises a series inductance L, and step (d) further comprises subtracting an impedance contribution of the inductance iωL, wherein ω=2πf and f is a frequency at which a respective measurement was performed.

4. The method according to claim 3, wherein, in step (a), the imaginary part is also measured and the inductance is calculated from the imaginary part.

5. The method according to claim 3, wherein frequencies $f_1$, $f_2$, $f_3$ and $f_4$ are used for the measurements in steps (a) and (c):
   $f_1$ is a frequency at which a Nyquist plot of the impedance of the equivalent circuit diagram has a zero crossing;
   $f_2$ is a frequency of 300 Hz or more, and is at least 5 times $f_1$,
   $f_3$ is a frequency at which the Nyquist plot of the impedance of the equivalent circuit diagram has an extreme value; and
   $f_4$ is a frequency in a range from 10 to 50 Hz; and
   wherein $f_2$, as a highest frequency, corresponds to the first frequency in step (a).

6. The method according to claim 5, wherein $f_1$ and $f_3$ are calculated from initial parameters or parameters of the equivalent circuit diagram estimated by a previous run of the method.

7. The method according to claim 1, wherein the equivalent circuit diagram comprises at least one further RC element having parameters $R_2$ and $C_2$.

8. A model-based method for monitoring a lithium ion cell and forecasting future power characteristics, the method comprising:
   providing the equivalent circuit diagram for representing the impedance of the lithium ion cell;
   ascertaining the parameters of the equivalent circuit diagram, including Rs, $R_1$ and $C_1$, using the method according claim 1;
   ascertaining a temperature and a state of charge; and
   ascertaining a state of health and forecasting the future power characteristics of the cell based on the parameters of the equivalent circuit diagram by incorporating the temperature and the state of charge.

9. A battery system, comprising:
   a plurality of lithium ion cells;
   a signal generator for generating a current or voltage signal as an excitation signal, wherein the system is not intended for use with an external excitation signal;

a voltage or current measurement apparatus for each cell, wherein the voltage or current measurement apparatus is configured to measure a response signal in response to the excitation signal;

a battery management system comprising a controller, wherein an equivalent circuit diagram for representing the impedance of the lithium ion cell is provided in a memory of the controller, and wherein, the equivalent circuit diagram comprises the at least one RC element with the ohmic resistance $R_1$, the capacitance $C_1$, and the series resistance Rs, and the battery management system is configured to monitor the lithium ion cells using the method according to claim 8.

* * * * *